US006952654B2

United States Patent
Park et al.

(10) Patent No.: US 6,952,654 B2
(45) Date of Patent: Oct. 4, 2005

(54) METHODS FOR CALCULATING THE VOLTAGE INDUCED IN A DEVICE

(75) Inventors: Cheolmin Park, Shrewsbury, MA (US); David Bertucci, Hudson, MA (US); Norbert R. Seifert, Newton, MA (US); Wei D. Tai, Northborough, MA (US); Raymond D. Hokinson, South Borough, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 184 days.

(21) Appl. No.: 10/662,637

(22) Filed: Sep. 15, 2003

(65) Prior Publication Data

US 2005/0060098 A1 Mar. 17, 2005

(51) Int. Cl.⁷ .......................... G01R 19/00; G06G 17/50
(52) U.S. Cl. ............................... 702/64; 702/72; 716/7
(58) Field of Search .............................. 702/57, 64, 65, 702/71, 72; 716/4, 7

(56) References Cited

U.S. PATENT DOCUMENTS 6,011,508 A * 1/2000 Perreault et al. ............ 342/350

OTHER PUBLICATIONS

Ernst Y. Wu et al.; "Experimental Evidence of TBD Power-Law for Voltage Dependence of Oxide Breakdown in Ultrathin Gate Oxides"; IEEE Transactions on Electron Devices, vol. 40, No. 12, Dec. 2002 (pp. 2244–2253).

* cited by examiner

*Primary Examiner*—John Barlow
*Assistant Examiner*—Meagan S Walling

(57) ABSTRACT

Methods are disclosed for calculating the amount of voltage coupled to a device. In some embodiments, the method may comprise identifying a conductor that is coupled to a device, extracting information regarding the relationship between the conductor coupled to the device and adjacent conductors, extracting information regarding signals that are present in the adjacent conductors, partitioning the signal information into phases, calculating a voltage induced in the conductor coupled to the device during each phase of the partitioned signal, calculating an average voltage induced in the conductor coupled to the device and, flagging the device if the average voltage induced is above a predetermined threshold.

24 Claims, 3 Drawing Sheets

METHODS FOR CALCULATING THE VOLTAGE INDUCED IN A DEVICE

BACKGROUND

Integrated circuits undergo a relatively complicated design process. Since the time-to-market for many integrated circuits can be brief, many integrated circuits may require functional operation the first time they are built. Consequently, the tools used in designing integrated circuits may be required to perform accurate circuit simulation in a relatively short period of time. Furthermore, Circuit-level design tools, such as SPICE, may perform nodal analyses at each node of a circuit. The nodal analyses performed by circuit-level tools often involve complex matrix calculations that provide accurate simulation information, but due to the complexity of the matrix calculations, circuit level analysis may be too time consuming. In an effort to decrease the simulation time, non-matrix calculations also may be employed, where the non-matrix calculations may make approximations regarding circuit behavior. Although the simulation time may be increased using non-matrix calculations, the accuracy of such calculations may suffer. Circuit designers may compensate for this decreased accuracy by designing circuits to margins that are greater than actual circuit performance, causing integrated circuits to be designed to more stringent design constraints than what may be needed.

BRIEF SUMMARY

Methods are disclosed for calculating the amount of voltage coupled to a device. In some embodiments, the method may comprise identifying a conductor that is coupled to a device, extracting information regarding the relationship between the conductor coupled to the device and adjacent conductors, extracting information regarding signals that are present in the adjacent conductors, partitioning the signal information into phases, calculating a voltage induced in the conductor coupled to the device during each phase of the partitioned signal, calculating an average voltage induced in the conductor coupled to the device, and flagging the device if the average voltage induced is above a predetermined threshold.

BRIEF DESCRIPTION OF THE DRAWINGS

For a detailed description of the embodiments of the invention, reference will now be made to the accompanying drawings, in which like parts may be labeled with like reference numerals.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
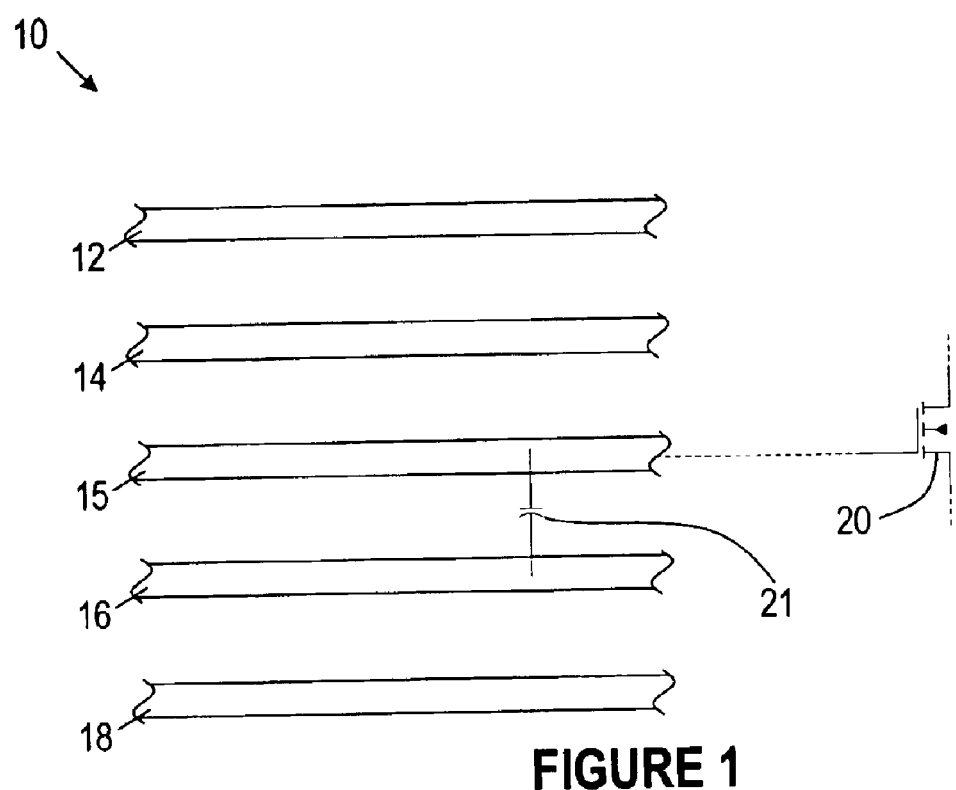
FIG. 1 illustrates an exemplary system.

FIG. 1 illustrates a system 10 including conductors 12–18. System 10 may be part of an electronic circuit that is integrated on a single chip using semiconductor fabrication techniques. Although the following discussion is directed to integrated circuits, the following discussion equally applies to discrete component systems. The conductors 12–18 may couple to various electrical devices in the integrated circuit. For example, a transistor 20 may couple to conductor 15. In addition, other electrical devices (not shown), such as capacitors, inductors, diodes, and resistors also may couple to the conductors 12–18. In general, conductors in system 10 are fabricated as close to each other as possible so that electrical devices may be densely packed in the integrated circuit. As a result, very small distances may separate conductors 12–18.

Conductors 12, 14, 16, and 18 may also carry various signals (such as clocking signals), to areas within the integrated circuit. Due to the switching nature of the signals carried by conductors 12, 14, 16, and 18, and the close proximity of the conductors 12–18, voltage may be capacitively coupled into conductor 15. For example, an effective capacitance 21 may exist between conductor 16 and conductor 15 as a result of their physical proximity illustrated in FIG. 1. In addition, the amount of voltage coupled into conductor 15 by capacitor 21 may vary based on the signal in conductor 16. Similarly, conductors 12, 14, and 18 also may couple voltage into conductor 15. The cumulative coupling effect from conductors 12, 14, 16, and 18 in conductor 15 may result in substantial voltage fluctuations in conductor 15, which in turn may result in device failure of devices coupled to conductor 15, such as transistor 20.

Figure 2:
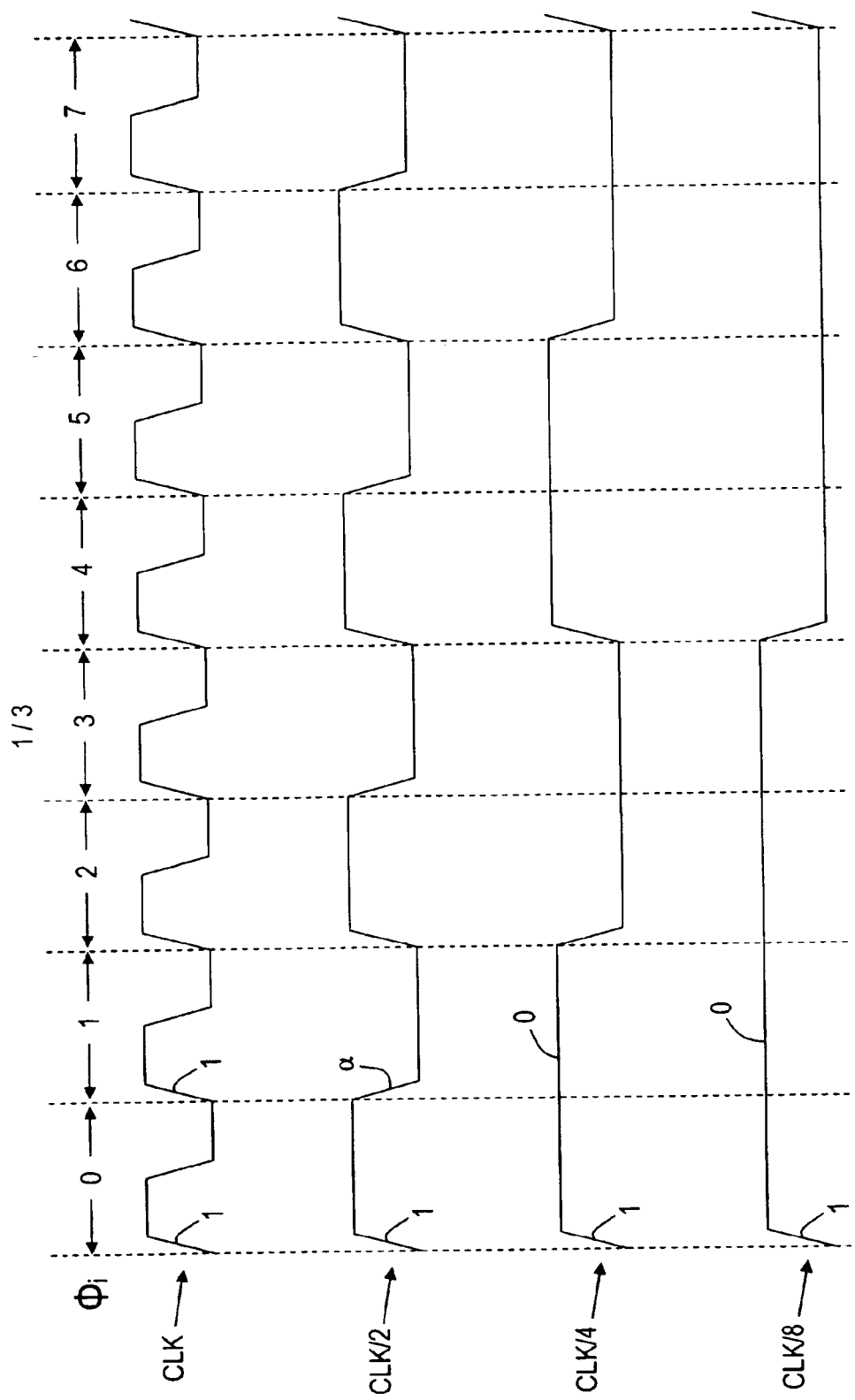
FIG. 2 illustrates exemplary signals.

Conductors 12, 14, 16, and 18 may include exemplary signals CLK, CLK/2, CLK/4, and CLK/8 respectively as illustrated in FIG. 2. As illustrated, CLK may have a predetermined frequency, and CLK/2, CLK/4, and CLK/8 may have frequencies that are multiples of CLK's predetermined frequency. For example, CLK may have a frequency of 1 GHz so that CLK/2 has a frequency of 500 MHz, CLK/4 has a frequency of 250 MHz, and CLK/8 has a frequency of 125 MHz. The amount of signal coupling from conductors 12, 14, 16, and 18 into conductor 15 may be related to the frequencies of CLK, CLK/2, CLK/4, and CLK/8. In accordance with some embodiments, the frequency contribution of adjacent conductors (i.e., conductors 12, 14, 16, and 18) may be used to determine the possibility of failure of the devices coupled to conductor 15. In this manner, the reliability for each electrical device on an integrated circuit may be determined and the long term reliability of the integrated circuit may be estimated.

Figure 3:
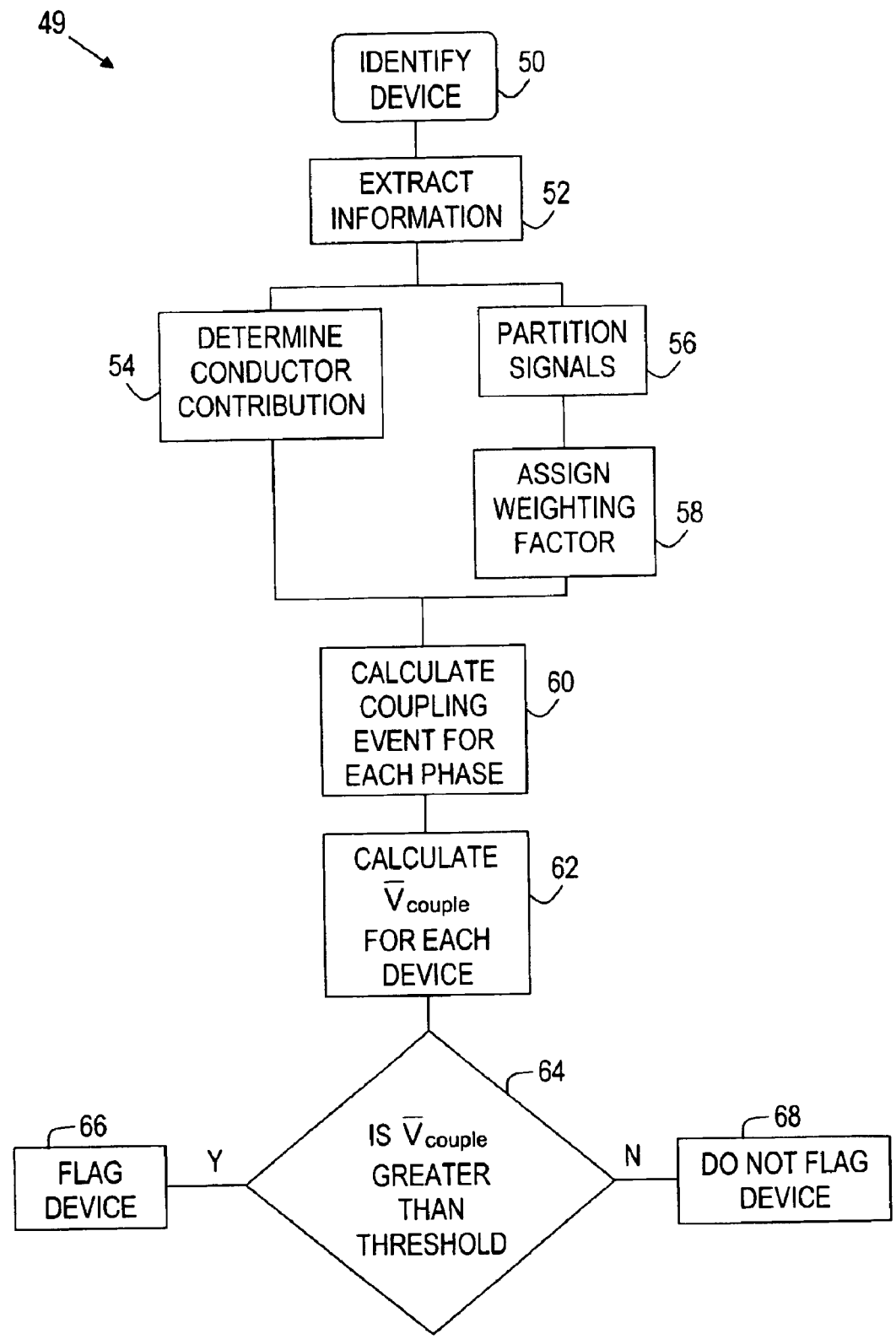
FIG. 3 illustrates an exemplary method for calculating the voltage induced in a device and its long term reliability.

FIG. 3 represents an exemplary method 49 for determining long term reliability of an integrated circuit as a function of coupling voltage. Although method 49 is explained below with regard to FIGS. 1 and 2, this disclosure applies to other systems as well. The total voltage coupled into conductor 15 may be determined by calculating a coupling contribution due to adjacent conductors 12, 14, 16, and 18, and weighting the coupling contribution of each conductor 12, 14, 16, and 18 based on the behavior of the signal in each conductor at various points in time. For example, the coupling contribution in conductor 15 as a result of conductor 16 may be related to the value of capacitor 21. Since this coupling contribution may depend on the signal in conductor 16, a weighting factor then may be determined from the behavior of CLK/4 at various points in time.

In block 50, device 20 and its conductor 15 may be identified for analysis. Adjacent conductors 12, 14, 16, and 18, which couple voltage into conductor 15, also may be identified in block 50. As described above, the amount of voltage coupled into conductor 15 may include a coupling contribution (e.g., an effective capacitance) due to the proximity of the adjacent conductors, as well as a weighting contribution due to CLK, CLK/2, CLK/4, and CLK/8. Accordingly, in analyzing the reliability of transistor 20, the design data may be examined, and information regarding the coupling contribution as well as information regarding the weighting contribution may be extracted from the design data as indicated in block 52.

Using the information extracted in block 52, the coupling contribution due to each conductor may be determined per block 54. The coupling contribution for each signal may be related to the capacitance between the conductors. For example, the design data may include information regarding the spacing d between adjacent conductors, the area A that the conductors have in common, and the dielectric constant $\epsilon$ of the material between the conductors. In this manner, the effective capacitance may be calculated according to Equation 1.

$$C = \varepsilon \cdot \frac{A}{d} \qquad \text{Eq. (1)}$$

Additionally, the information extracted in block 52 may be used to partition the signals CLK, CLK/2, CLK/4, and CLK/8, as indicated in block 56. Partitioning the signals may involve determining which of the signals has the smallest period and partitioning the signals by this period. For example, as illustrated in FIG. 2, CLK has the smallest period and CLK/8 has the longest period, therefore the signals are partitioned into phases $\phi_0$–$\phi_7$, where the size of each phase is determined by the size of the smallest period. The coupling contribution determined in block 54 may be calculated during $\phi_0$ and then extrapolated during phases $\phi_1$–$\phi_7$.

The amount of coupling between adjacent conductors also may vary with frequency. This frequency effect may be accounted for by assigning a weighting factor based on the switching of the signals CLK, CLK/2, CLK/4, and CLK/8 during each phase $\phi_0$–$\phi_7$, as indicated by block 58. The weighting factor may be related to the switching associated with the various signals. As illustrated in FIG. 2, a 1 may be associated with upward transitions (i.e., low to high transitions), a 0 may be associated with non-transition events (i.e., a signal continually high or continually low), and a variable weighting factor $\alpha$ may be associated with downward transition (i.e., high to low transitions) events. The variable weighting factor $\alpha$ may be disabled and set to 0, or enabled and set to some predetermined value. The enabled value of $\alpha$ is generally negative because $\alpha$ corresponds to a downward transition. The default setting for $\alpha$ is disabled. FIG. 2 illustrates the weighting factors that may be assigned to the signals during $\phi_0$ and $\phi_1$. Table 1 depicts weighting factors that may be assigned to the signals for all phases illustrated in FIG. 2.

Equation 2 may be used to calculate "coupling events", or the total voltage $V_{couple,\,i}$ coupled into conductor 15 as a result of the various coupling contributions and the various weighting factors during each phase $\phi_i$. The weighting factors associated with the various transitions for signals CLK, CLK/2, CLK/4, and CLK/8 are represented in Equation 2 by $\chi$. The coupling contribution between conductor 15 and conductors 12, 14, 16, and 18 are represented in Equation 2 by $\phi_j$, $\phi_k$, $\phi_l$, and $\phi_m$ respectively.

$$V_{couple} = \chi_{CLK} \sum_j \varphi_j \cdot (CLK) + \chi_{CLK/2} \sum_k \varphi_k \cdot (CLK/2) + \qquad \text{Eq. (2)}$$
$$\chi_{CLK/4} \sum_l \varphi_l \cdot (CLK/4) + \chi_{CLK/8} \sum_m \varphi_m \cdot (CLK/8)$$

Block 60 corresponds to determining the coupling event for each phase of Table 1, per Equation 2.

TABLE 1

| Phase $\phi_i$ | CLK | CLK/2 | CLK/4 | CLK/8 | $V_{couple,i}$ |
|---|---|---|---|---|---|
| 0 | 1 | 1 | 1 | 1 | CLK + CLK/2 + CLK/4 + CLK/8 |
| 1 | 1 | α | 0 | 0 | CLK + α(CLK/2) |
| 2 | 1 | 1 | A | 0 | CLK + CLK/2 + α(CLK/4) |
| 3 | 1 | α | 0 | 0 | CLK + α(CLK/2) |
| 4 | 1 | 1 | 1 | α | CLK + CLK/2 + CLK/4 + CLK/8 |
| 5 | 1 | α | 0 | 0 | CLK + α(CLK/2) |
| 6 | 1 | 1 | A | 0 | CLK + CLK/2 + α(CLK/4) |
| 7 | 1 | α | 0 | 0 | CLK + α(CLK/2) |

The coupling analysis of block 60 subsequently may be used to assess long term reliability of the device identified in block 50. Some embodiments may include determining an average value of $\overline{V}_{couple}$ for each device as a result of the multiple coupling events (i.e., the coupling events associated with phases $\phi_0$–$\phi_7$). Equation 3 may be used to calculate an average value of $\overline{V}_{couple}$ for each device as a result of the multiple coupling events N, various fabrication parameters, as well as various circuit parameters.

$$\overline{V}_{couple} = \left[ \frac{1}{a} \left\{ \frac{1}{N} \sum_i^N \left( \frac{1}{a(V_{dd} + V_{couple,i})^{K_p}} \right)^{\beta} \right\}^{-\frac{1}{\beta}} \right]^{\frac{1}{K_p}} - V_{dd} \qquad \text{Eq. (3)}$$

In Equation 3, N refers to the number of coupling events. For example, if there are 8 phases as illustrated in FIG. 2, there may be a coupling event for each phase and N will equal 8. $\beta$ is a term that is related to the gain of the device and may vary depending on the type of the device being characterized. For example, MOSFET devices may have values for $\beta$ that range from 0.5 to 1.5, where an N-type MOSFET may have a value different than a P-type MOSFET. The scaling factor 'a' in Equation 3 may be associated with the area, gain $\beta$, and temperature, of the device. The actual value of 'a' may vary depending on the type of device, e.g., N-type MOSFET versus P-type MOSFET, where MOSFET devices may have values for 'a' that have a power-law behavior for their time-to-breakdown as described in "Experimental Evidence of $T_{BD}$ Power-Law for Voltage Dependence of Oxide Breakdown in Ultrathin Gate Oxides," by Wu et al. $K_P$ is a term that is related to the mobility of the device and may vary depending on the type of device used. For example, an N-type MOSFET may have a $K_P$ value equal to about 53 at room temperature, whereas a P-type MOSFET may have a $K_P$ value equal to about 40 at room temperature. Also, $V_{dd}$ in Equation 3 is a circuit parameter that refers to the maximum voltage supplied to the device.

With the average value of $\overline{V}_{couple}$ determined, the impact that $\overline{V}_{couple}$ has on various devices may be studied. For example, transistor 20 may be an N-type Metal Oxide Semiconductor Field Effect Transistor (MOSFET) as illustrated in FIG. 1, where the gate region of transistor 20 includes dielectric material. Voltages that couple to the gate region of transistor 20 may cause the integrity of the gate dielectric to fail over time, resulting in a short between the gate and the channel of transistor 20. The manufacturing facility may provide Time Dependent Dielectric Breakdown (TDDB) guidelines that indicate voltage thresholds for the various devices within the system. Devices that experience voltages above the TDDB threshold may fail over time. Accordingly, the average value of $\overline{V}_{couple}$ may be compared to the TDDB threshold as indicated by block 64. If the value of $\overline{V}_{couple}$ calculated in block 62 is greater than the TDDB threshold, then the device may be flagged per block 66. Alternatively, if the value of $\overline{V}_{couple}$ calculated in block 62 is less than the TDDB threshold, then flagging the device may not be required, as indicated by block 68.

The above discussion is meant to be illustrative of the principles and various embodiments of the present invention. Numerous variations and modifications will become apparent to those skilled in the art once the above disclosure is fully appreciated. For example, although four conductors were shown coupling noise into conductor 15, more or less conductors are possible. Also, although MOSFET devices were used in the foregoing discussion, this discussion equally applies to any device that may suffer from TDDB, such as capacitors. It is intended that the following claims be interpreted to embrace all such variations and modifications.

What is claimed is:

1. A method, comprising:
   identifying a conductor that is coupled to a device;
   extracting information regarding the relationship between the conductor coupled to the device and adjacent conductors;
   extracting information regarding a plurality of signals that are present in the adjacent conductors;
   partitioning the information into phases;
   calculating a voltage induced in the conductor coupled to the device during each phase;
   calculating an average voltage induced in the conductor coupled to the device; and
   flagging the device if the average voltage induced is above a predetermined threshold.

2. The method of claim 1, wherein information is extracted from a design database.

3. The method of claim 1, wherein partitioning the information into phases further comprises associating a weighting factor to each phase.

4. The method of claim 3, wherein associating a weighting factor to each phase further comprises associating a 1 with a low-to-high transition and a 0 with a non-changing transition.

5. The method of claim 4, wherein a high-to-low transition is associated with a predetermined weighting factor.

6. The method of claim 5, wherein the predetermined weighting factor is negative.

7. The method of claim 6, wherein a default value for the predetermined weighting factor is 0.

8. The method of claim 3, wherein calculating the voltage induced in the conductor comprises iteratively adding the weighting factors due to each phase.

9. The method of claim 8, wherein the number of iterative additions is related to the number of phases.

10. The method of claim 9, wherein the plurality of signals are partitioned according to a smallest period among the signals.

11. The method of claim 9, wherein the flagging of devices aids in designing integrated circuits.

12. The method of claim 8, wherein calculating the voltage induced in the conductor comprises determining a non-weighted factor that is related to the relationship between the conductor coupled to the device and the adjacent conductors.

13. The method of claim 12, wherein the non-weighted factor is related to a capacitance between adjacent conductors.

14. The method of claim 12, wherein the weighted factor is related to a frequency of the signals in the adjacent conductors.

15. The method of claim 12, wherein the average voltage is related to an amount of voltage induced during each phase and the device's fabrication parameters of the device.

16. The method of claim 15, wherein the device comprises an N-type metal oxide semiconductor field effect transistor (MOSFET) and the fabrication parameters comprise electron mobility.

17. The method of claim 12, wherein the weighting factors are added and the sum of the weighting factors is multiplied times the non-weighted factor.

18. The method of claim 8, wherein the predetermined threshold is related to a time dependent dielectric breakdown (TDDB) of the device.

19. The method of claim 1, wherein the device comprises a dielectric material, and flagging the device indicates probable failure of the dielectric material.

20. A method, comprising:
    identifying a device;
    extracting information regarding the device from a database;
    partitioning the extracted information into phases;
    determining a weighted coupling contribution;
    determining a non-weighted coupling contribution; and
    calculating a voltage induced during each phase, wherein the voltage induced is determined using the weighted and non-weighted coupling contributions.

21. The method of claim 20, wherein the device comprises a dielectric and the device is coupled to a first conductor.

22. The method of claim 20, further comprising calculating the average voltage induced due to all the phases, wherein the average voltage induced due to all phases is related to the fabrication parameters of the device as well as an amount of voltage induced during each phase.

23. The method of claim 22, further comprising comparing the average voltage induced to a predetermined threshold.

24. The method of claim 23, further comprising flagging the device if the average voltage induced is greater than a predetermined threshold.

* * * * *